US006450654B1

(12) United States Patent
Koester

(10) Patent No.: US 6,450,654 B1
(45) Date of Patent: Sep. 17, 2002

(54) POLYSILICON MICROELECTRIC REFLECTORS

(75) Inventor: David Alan Koester, Burlington, NC (US)

(73) Assignee: JDS Uniphase Corporation, San Jose, CA (US)

(*) Notice: Subject to any disclaimer, the term of this patent is extended or adjusted under 35 U.S.C. 154(b) by 0 days.

(21) Appl. No.: 09/704,264

(22) Filed: Nov. 1, 2000

(51) Int. Cl.$^7$ .............................................. G02S 7/182
(52) U.S. Cl. ....................... 359/872; 359/871; 359/223; 359/224
(58) Field of Search ................................ 359/872, 871, 359/223, 224, 294, 838; 438/737, 738, 742; 216/101, 41, 2; 73/718, 724

(56) References Cited

U.S. PATENT DOCUMENTS

| | | | | | |
|---|---|---|---|---|---|
| 5,262,000 A | * | 11/1993 | Welbourn et al. | ............ | 216/101 |
| 6,109,113 A | * | 8/2000 | Chavan et al. | ................. | 73/706 |
| 6,187,686 B1 | * | 2/2001 | Shin et al. | ..................... | 216/51 |
| 6,201,631 B1 | * | 3/2001 | Greywall | .................... | 335/222 |

OTHER PUBLICATIONS

Koester et al., Mumps™ Design Handbook, Revision 4.0, May 1999, 37 pp.
Lee et al., *Effects of Phosphorus on Stress of Multi–Stacked Polysilicon Film and Single Crystalline Silicon*, J. Micromech. Microeng., vol. 9, 1999, pp. 252–263.
Koch et al., *Microstructural Changes in Vapour–Deposited Silver, Copper and Gold Films Investigated by Internal Stress Measurements*, Thin Solid Films, vol. 140, 1986, pp. 217–226.

* cited by examiner

*Primary Examiner*—Mohammad Sikder
(74) *Attorney, Agent, or Firm*—Myers Bigel Sibley & Sajovec

(57) ABSTRACT

A microelectronic reflector is fabricated by forming a first polysilicon layer on a microelectronic substrate, forming a first phosphosilicate glass (PSG) layer on the first polysilicon layer, and reactive ion etching to remove the first PSG layer from at least a portion of the first polysilicon layer. A second polysilicon layer is formed on at least a portion of the first polysilicon layer from which the first PSG layer was removed and a second PSG layer is formed on at least a second portion of the second polysilicon layer. Reactive ion etching is performed to remove the second PSG layer from at least a portion of the second polysilicon layer. A third PSG layer then is formed on at least a portion of the second polysilicon layer from which the second PSG layer was removed. Reactive ion etching is performed to remove the third PSG layer from at least a portion of the second polysilicon layer. By forming a third PSG layer, and reactive ion etching this layer, additional stress may be created in the first and/or second doped polysilicon layers that bends the ends of the doped first and/or second polysilicon layers towards the microelectronic substrate upon release of the treated polysilicon layer from the substrate, compared to doped polysilicon layers on which the third PSG layer was not formed and reactive ion etched. This increased stress may be counteracted by forming a stress-correcting layer on at least a portion of the second polysilicon layer from which the third PSG layer was removed, and then forming a reflective layer such as gold on at least a portion of the stress-correcting layer. The stress-correcting layer preferably comprises platinum, which can produce high stresses that can counteract the stresses in the first and second doped polysilicon layers, to thereby allow a flat mirror and/or beam to be produced.

13 Claims, 5 Drawing Sheets

POLYSILICON MICROELECTRIC REFLECTORS

FIELD OF THE INVENTION

This invention relates to microelectromechanical systems (MEMS) devices and methods of fabricating same, and more particularly to MEMS reflectors and beams and methods of fabricating same.

BACKGROUND OF THE INVENTION

Optical communication systems are increasingly being used to communicate data, voice, multimedia and/or other communications. Optical communication systems may employ optical fibers and/or free space optical communication paths. It will be understood by those having skill in the art that optical communication systems may use optical radiation in the visible, ultraviolet, infrared and/or other portions of the electromagnetic radiation spectrum.

Reflectors, such as mirrors, are widely used in optical communications systems. For example, optical cross-connect (OXC) switches can include an array of reflectors to reflect optical energy from any switch input to any switch output. Similarly, add-drop optical switches also may use an array of reflectors such as mirrors to couple various optical paths.

It has been proposed to fabricate reflectors using microelectromechanical system (MEMS) technology. As is well known to those having skill in the art, MEMS devices are potentially low cost devices, due to the use of microelectronic fabrication techniques. New functionality also may be provided, because MEMS devices can be much smaller than conventional electromechanical devices.

One well-known and widely used process for fabricating MEMS devices is the MUMPs™ process that is marketed by Cronos Integrated Microsystems, and is described in the *MUMPS™ Design Handbook,* Revision 4.0, by the present inventor Koester et al., May 1999, the disclosure of which is hereby incorporated herein by reference in its entirety. In particular, as described in the *MUMPs™ Design Handbook,* Section 1.2, the MUMPs process is a three-layer polysilicon surface micromachining process derived from work performed at the Berkeley Sensors and Actuators Center (BSAC) at the University of California in the late 1980s and early 1990s. Several modifications and enhancements have been made to increase the flexibility and versatility of the process for the multi-user environment.

The process begins with 100 mm n-type (100) silicon wafers of 1–2 Ω-cm resistivity. The surface of the wafers are first heavily doped with phosphorus in a standard diffusion furnace using $POCl_3$ as the dopant source. This helps to reduce or prevent charge feedthrough to the substrate from electrostatic devices on the surface. Next, a 600 nm low-stress Low Pressure Chemical Vapor Deposition (LPCVD) silicon nitride layer is deposited on the wafers as an electrical isolation layer. This is followed directly by the deposition of a 500 nm LPCVD polysilicon film-Poly 0. Poly 0 is then patterned by photolithography, a process that includes the coating of the wafers with photoresist, exposure of the photoresist with the appropriate mask and developing the exposed photoresist to create the desired etch mask for subsequent pattern transfer into the underlying layer. After patterning the photoresist, the Poly 0 layer is then etched in a Reactive Ion Etch (RIE) system. A 2.0 $\mu$m phosphosilicate glass (PSG) sacrificial layer is then deposited by LPCVD and annealed at 1050° C. for one hour in argon. This layer of PSG, known as a first oxide, is removed at the end of the process to free the first mechanical layer of polysilicon. The sacrificial layer is lithographically patterned with a dimpled mask and the dimples are transferred into the sacrificial PSG layer by RIE. The nominal depth of the dimples is 750 nm. The wafers are then patterned with the third mask layer, ANCHOR1, and reactive ion etched. This step provides anchor holes that will be filed by the Poly 1 layer.

After etching ANCHOR1, the first structural layer of polysilicon (Poly 1) is deposited at a thickness of 2.0 $\mu$m. A thin (200 nm) layer of PSG is deposited over the polysilicon and the wafer is annealed at 1050° C. for one hour. The anneal dopes the polysilicon with phosphorus from the PSG layers both above and below it. The anneal also serves to significantly reduce the net stress in the Poly 1 layer. The polysilicon (and its PSG masking layer) is lithographically patterned using a mask designed to form the first structural layer POLY1. The PSG layer is etched to produce a hard mask for the subsequent polysilicon etch. The hard mask is more resistant to the polysilicon etch chemistry than the photoresist and ensures better transfer of the pattern into the polysilicon. After etching the polysilicon, the photoresist is stripped and the remaining oxide hard mask is removed by RIE.

After Poly 1 is etched, a second PSG layer (Second Oxide) is deposited and annealed. The Second Oxide is patterned using two different etch masks with different objectives. The POLY1—POLY2—VIA level provides for etch holes in the Second Oxide down to the Poly 1 layer. This provides a mechanical and electrical connection between the Poly 1 and Poly 2 layers. The POLY1—POLY2—VIA layer is lithographically patterned and etched by RIE. The ANCHOR2 level is provided to etch both the First and Second Oxide layers in one step, thereby eliminating any misalignment between separately etched holes. More importantly, the ANCHOR2 etch eliminates the need to make a cut in First Oxide unrelated to anchoring a Poly 1 structure, which needlessly exposes the substrate to subsequent processing that can damage either Poly 0 or Nitride. The ANCHOR2 layer is lithographically patterned and etched by RIE in the same way as POLY1—POLY2—VIA.

The second structural layer, Poly 2, is then deposited (1.5 $\mu$m thick) followed by the deposition of 200 nm PSG. As with Poly 1, the thin PSG layer acts as both an etch mask and dopant source for Poly 2. The wafer is annealed for one hour at 1050° C. to dope the polysilicon and reduce the residual film stress. The Poly 2 layer is lithographically patterned with the seventh mask (POLY2) and the PSG and polysilicon layers are etched by RIE using the same processing conditions as for Poly 1. The photoresist then is stripped and the masking oxide is removed. The final deposited layer in the MUMPs process is a 0.5 $\mu$m metal layer including about 200 Å of a chromium adhesion layer and about 5000 Å of gold, that provides for probing, bonding, electrical routing and highly reflective mirror surfaces. The wafer is patterned lithographically with the eighth mask (METAL) and the metal is deposited and patterned using lift-off. The wafers are diced, sorted and shipped to the MUMPs user for sacrificial release and test. The release is performed by immersing the chip in a bath of 49% HF (room temperature) for 1.5–2 minutes. This is followed by several minutes in DI water and then alcohol to reduce stiction followed by at least 10 minutes in an oven at 1000° C.

Microelectronic reflectors have been fabricated with the above-described MUMPs process, using a multilayer polysilicon base, a chromium adhesion layer and a gold reflective surface. Unfortunately, it may be difficult to form planar microelectronic reflectors using the above-described MUMPs process. In particular, stress gradients in the stacked polysilicon layers in conjunction with the internal stress of the deposited metal or metals, may produce reflectors that are not acceptably flat.

More particularly, it is known that phosphorus-doped polysilicon films may be slightly compressive. See, for example, the publication by Lee et al. entitled *Effects of Phosphorus on Stress of Multi-Stacked Polysilicon Film and Single Crystalline Silicon,* Journal of Micromechanical Micoengineering, Volume 9, pp. 252–263, Feb. 1999. Moreover, it is also known that the intrinsic film stress of most evaporated metal films is tensile. However, it may be difficult to fabricate a gold layer that has intrinsic film stress that is equal and opposite to the stress in the polysilicon layer or layers.

Finally, gold also has a high self-diffusion rate, and has been shown to undergo grain growth at temperatures as low as 90° C. The tensile stress may increase in conjunction with this grain growth, as the volume of the gold film decreases. See for example, the publication by Koch entitled Microstructural Changes in Vapour-Deposited Silver, Copper and Gold Films Investigated by Internal Stress Measurements, Thin Solid Films, Vol. 140, 1986, pp. 217–226. Higher and higher temperatures show an increasing degree of stress. For at least these reasons, gold coated polysilicon reflectors, with or without an adhesion-promoting layer, may not be, or may not remain, planar.

It also is known to control stress in polysilicon layers fabricated by a MUMPs process by ion milling the second polysilicon layer. Unfortunately, it may be difficult to integrate ion milling with conventional microelectronic fabrication processes such as are used in MUMPs or other MEMS fabrication processing. Accordingly, in view of the above discussion, there continues to be a need for methods of fabricating flat microelectronic reflectors that can remain flat over time and/or temperature changes.

SUMMARY OF THE INVENTION

Embodiments of the present invention can provide methods of fabricating a microelectronic reflector by forming a first polysilicon layer on a microelectronic substrate, forming a first polysilicon doping layer, such as a first phosphosilicate glass (PSG) layer, on the first polysilicon layer, and reactive ion etching to remove the first PSG layer from at least a portion of the first polysilicon layer. A second polysilicon layer is formed on at least a portion of the first polysilicon layer from which the first PSG layer was removed. A second polysilicon doping layer, such as a second PSG layer, is formed on at least a second portion of the second polysilicon layer. Reactive ion etching is performed to remove the second PSG layer from at least a portion of the second polysilicon layer. A third polysilicon doping layer, such as a third PSG layer, then is formed on at least a portion of the second polysilicon layer from which the second PSG layer was removed. Reactive ion etching is performed to remove the third PSG layer from at least a portion of the second polysilicon layer. A reflective layer then is formed on at least a portion of the second polysilicon layer from which the third PSG layer was removed.

It has been found, according to the present invention, that by forming and reactive ion etching a third PSG layer, additional stress may be created in the first and/or second doped polysilicon layers that bends the ends of the doped first and/or second polysilicon layers towards the microelectronic substrate upon release of the treated polysilicon layer from the substrate, compared to doped polysilicon layers on which the third PSG layer was not formed and reactive ion etched. This increased stress may be caused by the increased doping of the second and/or first polysilicon layer by the third PSG layer, by the surface modification that is created, by reactive ion etching to remove the third PSG layer and/or by other mechanisms. In any event, increased curvature in the combined first and second doped polysilicon layers thereby may be provided, without the need to perform ion milling. Stated differently, the radius of curvature may be modified.

According to other embodiments of the present invention, this increased stress may be counteracted by forming a stress-correcting layer on at least a portion of the second polysilicon layer from which the third PSG layer was removed, and then forming a reflective layer such as gold on at least a portion of the stress-correcting layer. The stress-correcting layer preferably comprises platinum, which can produce high stresses that can counteract the stresses in the first and second doped polysilicon layers, to thereby allow a flat mirror to be produced. The gold layer that is formed on the stress-correcting layer can act as a reflector. However, since the stress-correcting layer provides most, and preferably all, of the stress correction, flat reflectors may be provided that can remain flat over time and temperature. An adhesion-promoting layer such as titanium and/or chromium also may be provided between the stress-correcting layer and the second polysilicon layer.

According to other embodiments of the invention, a fourth PSG layer may be formed on the first polysilicon layer after reactive ion etching to remove the first PSG layer. Reactive ion etching may be performed to remove the fourth PSG layer from at least a portion of the first polysilicon layer. The second polysilicon layer then may be formed on at least a portion of the first polysilicon layer from which the fourth PSG layer has been removed.

Moreover, according to other embodiments of the invention, after forming each PSG layer, the PSG layer can be annealed, for example at about 1050° C. for about one hour in argon, to dope the polysilicon with phosphorus from the PSG layer and/or to reduce the stress in the polysilicon layer. In other embodiments of the present invention, the titanium or chromium layer can be about 50 Å thick, the platinum layer can be at least about 200 Å thick, and preferably can be between about 200 Å and about 300 Å thick, and the gold layer can be about 50 Å thick. In yet other embodiments, the platinum layer can be at least twice as thick as the sum of the thickness of the titanium and/or chromium layer and the gold layer.

According to yet other embodiments of the present invention, the above-described metallization for microelectronic reflectors can be used with other doped polysilicon layer fabrication processes. Accordingly, a doped polysilicon base is formed on a microelectronic substrate. A metal stress-correcting layer is formed on at least a portion of the doped polysilicon base. A metal reflective layer is formed on at least a portion of the metal stress-correcting layer. Prior to forming the metal stress-correcting layer, a metal adhesion-promoting layer also may be formed on the doped polysilicon base. The composition and/or thicknesses of the metal adhesion-promoting layer, the metal stress-correcting layer and the metal reflective layer may be as was described above.

In other embodiments of the present invention, the doped polysilicon base may be fabricated by forming a doped polysilicon layer on a microelectronic substrate and treating the doped polysilicon layer to create stress therein that bends the ends of the polysilicon layer towards the microelectronic substrate upon release of the treated polysilicon layer from the substrate, compared to an untreated doped polysilicon layer. A metal stress-correcting layer then may be formed that has stress therein that counters the stress in the treated doped polysilicon layer, to thereby create a planar reflector.

Microelectronic reflectors according to embodiments of the present invention can include a microelectronic substrate and a doped polysilicon base that is spaced apart from the microelectronic substrate. A metal stress-correcting layer is included on the doped polysilicon base, opposite the substrate. A metal reflective layer is included on the metal stress-correcting layer. A metal adhesion-promoting layer also may be provided between the doped polysilicon base and the metal stress-correcting layer. The compositions and/or dimensions of the metal adhesion-promoting layer, the metal stress-correcting layer and the metal reflective layer may be provided as was described above.

Yet other embodiments of the present invention can provide metallization for microelectronic reflectors that include a doped polysilicon base that is spaced apart from a microelectronic substrate. The metallization includes a platinum layer on the doped polysilicon base opposite the substrate, and a gold layer on the platinum layer. A titanium and/or chromium layer also may be provided between the doped polysilicon base and the platinum layer. The thicknesses thereof may be as was described above.

It also will be understood by those having skill in the art that embodiments of the above-described methods and structures may be used to form polysilicon MEMS beams that do not necessarily function as reflectors, but that are flat. Moreover, unlike conventional bimorph structures, these beams can remain flat over a wide range of temperatures and/or for an extended period of time. Accordingly, flat reflectors and/or beams may be provided by treating a polysilicon base to increase the bending of the ends thereof towards the substrate, and providing a metal stress-correcting layer to flatten the resultant structure.

BRIEF DESCRIPTION OF THE DRAWINGS

FIGS. 5B', 5D' and 5H' illustrate phosphorus doping concentrations during the steps of FIGS. 5B, 5D and 5H, respectively.

FIGS. 5G' and 5I' illustrate curvatures of polysilicon beams during steps 5G and 5I, respectively, if these beams were released from the substrate.

DETAILED DESCRIPTION OF PREFERRED EMBODIMENTS

Figure 1:
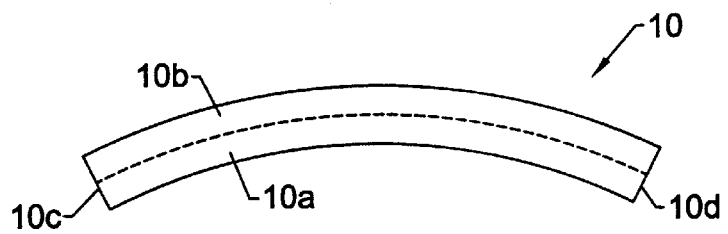
FIG. 1 is a cross-sectional view of a desired shape of a polysilicon base for a microelectronic reflector and/or beam.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" another element, it can be directly on the other element or intervening elements may also be present. In contrast, when an element is referred to as being "directly on" another element, there are no intervening elements present. It also will be understood that when a material such as polysilicon, phosphosilicate glass, metal, chromium, titanium, platinum or gold, is used to describe a layer, the layer shall include the described material and other materials also may be present. Accordingly, for example, the term "a platinum layer" shall be construed as if the term "a layer comprising platinum" was used, such that the layer contains platinum and also may contain other materials. Finally, the terms "concave" and "convex" both are used herein as viewed from the substrate.

Prior to providing a detailed description of embodiments of methods and devices according to the present invention during intermediate fabrication steps, an overview of stress compensation in polysilicon-based reflectors and/or beams according to the present invention first will be described. By providing reflectors with large radii of curvature, low optical insertion loss may be provided in MEMS-based optical systems.

In general, doped polysilicon may be used as the structural layer for a MEMS-based reflector. However, the surface of doped polysilicon generally forms a poor reflector. Accordingly, it generally is desirable to coat the doped polysilicon with a reflective layer, preferably a metal. Gold is commonly used, with an underlying optional titanium and/or chromium adhesion-promoting layer. Since evaporated metal films are almost always tensile in nature, the polysilicon reflector preferably is fabricated to have a radius of curvature that is concave relative to the substrate. The tensile metal film therefore can flatten the reflector.

FIG. 1 is a cross-sectional view of a desired shape of a single layer or multilayer polysilicon base for a microelectronic reflector that is released from a substrate. An embodiment of a polysilicon base 10 includes first and second doped polysilicon layers 10a and 10b, respectively. As shown in FIG. 1, the ends 10c and 10d of a released polysilicon base 10 preferably bend towards the substrate 12 so that the base 10 has a concave shape when viewed from the substrate 12. Thus, the ends 10c and 10d of the polysilicon base 10 are closer to the substrate 12 than an intermediate portion thereof. When a tensile metal is formed on the second polysilicon layer 10b, a flat structure then may be formed.

Figure 2A:
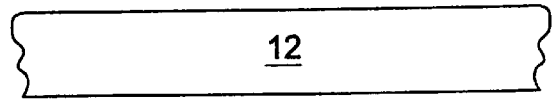
FIGS. 2A–2C are cross-sectional views of polysilicon bases that are formed using conventional MEMS processes.
Figure 2B:

Unfortunately, as shown in FIG. 2A, when single layer or multilayer polysilicon bases 20 are formed using conventional MEMS processes such as the MUMPs process that was described above, the resultant polysilicon base 20 may be flat relative to the substrate 22 as shown in FIG. 2A, for example having a radius of curvature of more than about 200 mm. Alternatively, as shown in FIG. 2B, the polysilicon base 20' may be slightly convex relative to the substrate 22, having a radius of curvature of about 100 mm. In yet another alternative, as shown in FIG. 2C, the polysilicon base 20"

may be only slightly concave, by an amount that is insufficient to form a flat mirror when metallized. For example, it may have a radius of curvature of about 100 mm.

Figure 2C:
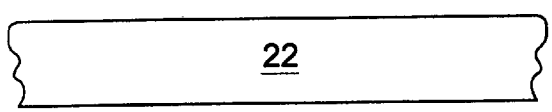
Figure 3:
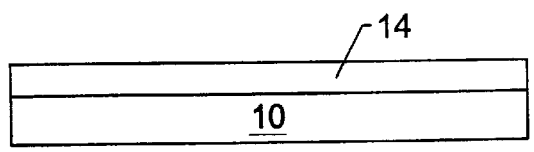
FIG. 3 is a cross-sectional view of a desirable shape of a metallized polysilicon base for a microelectronic reflector and/or beam.
Figure 3:
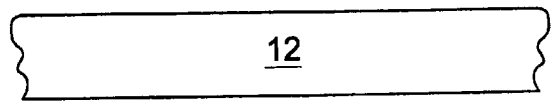

In all of the cases shown in FIGS. 2A–2C, it may be difficult to form a metallized polysilicon base that remains flat upon release from a substrate 12 as shown in FIG. 3. Thus, it may be difficult to form a polysilicon base 10 that is metallized with at least one metal layer 14 as shown in FIG. 3, and that has a radius of curvature that is more than about 200 mm when released from a substrate 12. Moreover, it may be difficult to maintain this radius of curvature over an extended time period and over a range of temperatures from about −5° C. to about +90° C.

Figure 4A:
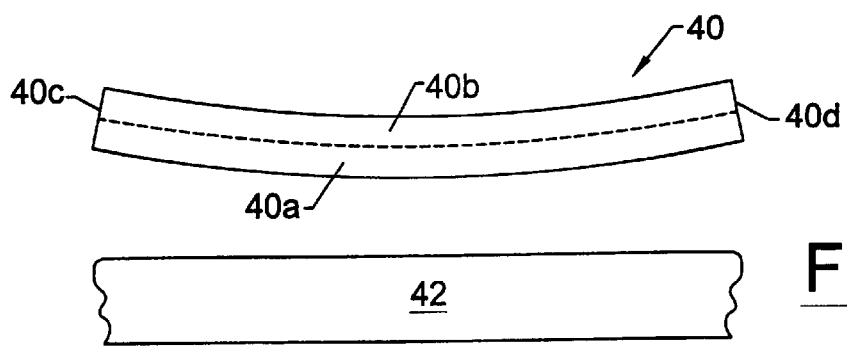
FIGS. 4A–4C are cross-sectional views of microelectronic reflectors and/or beams according to embodiments of the present invention during intermediate fabrication steps.
Figure 4B:
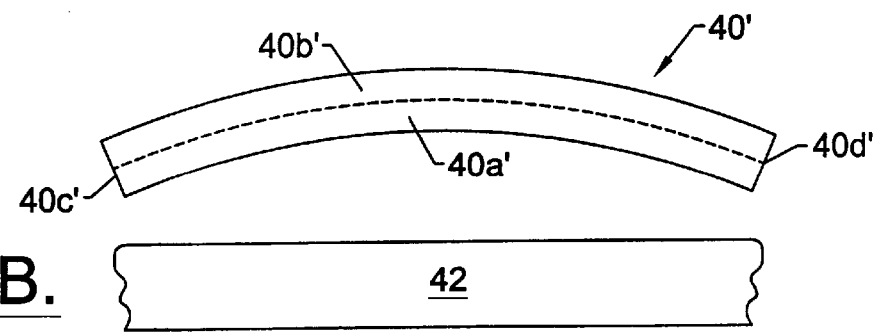
Figure 4C:
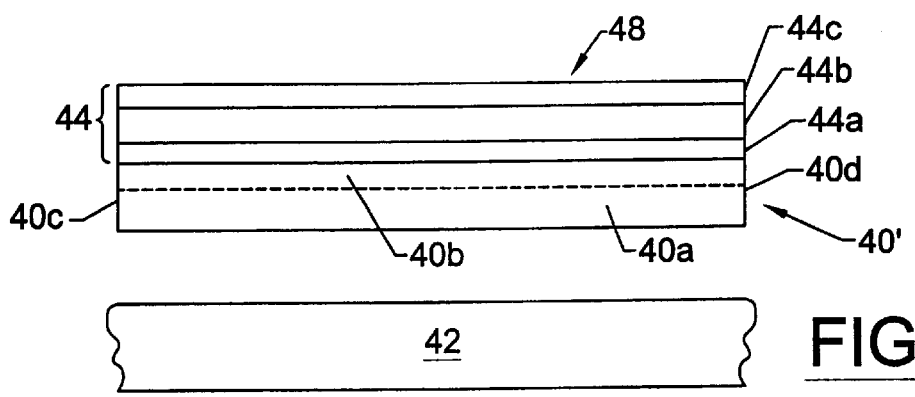

FIGS. 4A–4C are cross-sectional views of MEMS reflectors and/or beams according to embodiments of the present invention during intermediate fabrication steps. As shown in FIG. 4A, a conventional polysilicon base 40, including a first doped polysilicon layer 40a and second doped polysilicon layer 40b, is formed on a substrate 42. FIG. 4A illustrates the base 40 that is released from the substrate 42 in order to illustrate that conventional MEMS fabrication processes such as the MUMPs process described above, form a polysilicon base 40 that may be slightly convex relative to the substrate 42, so that the ends 40c and 40d are further from the substrate 42 than the intermediate portion of the base 40. A slightly concave polysilicon base also may be formed. In any event, it will be understood that, at this point in the processing, the base typically is not released.

Referring now to FIG. 4B, according to the invention, additional processing is performed on the polysilicon base 40, to treat the polysilicon base 40 and create stress therein that bends the ends 40c', 40d' of the treated polysilicon base 40' towards the microelectronic substrate 42 upon release thereof from the substrate, compared to the untreated base of FIG. 4A. For example, the radius of curvature of the base 40' of FIG. 4B may be decreased to about 60 mm concave relative to the substrate 42, compared to the radius of curvature of about 90 mm convex relative to the substrate 42 for base 40 of FIG. 4A. As will be described in detail below, the curvature may be decreased in FIG. 4B by forming a third polysilicon doping layer such as phosphosilicate glass (PSG) on the second polysilicon layer 40b', annealing, and then reactive ion etching to remove the third PSG layer from at least a portion of the second polysilicon layer 40b'.

Finally, referring to FIG. 4C, metallization 44 is formed on the polysilicon base 40'. Thus, when released from the substrate 42 as shown in FIG. 4C, a relatively flat reflector or beam 48 may be formed, having a radius of curvature which exceeds about 200 mm and that remains flat for an extended time period. As will be described in detail below, the metallization 44 preferably includes an adhesion-promoting layer 44a, preferably comprising titanium and/or chromium, a bulk or stress-correcting layer 44b, preferably comprising platinum, and an optional reflective layer 44c, preferably comprising gold. Preferably, the bulk or stress-correcting layer 44b is at least twice as thick as the sum of the adhesion-promoting layer 44a and the reflective layer 44c, so that the bulk of the stress correction is provided by the stress-correcting layer 44b. In preferred embodiments, the adhesion-promoting layer is about 50 Å of titanium and/or chromium, the stress-correcting layer is about 200 Å to about 300 Å of platinum, and the reflective layer 44c is about 50 Å of gold.

In particular, the intrinsic film stress of most evaporated metal films is tensile. Gold has been shown to produce low intrinsic stress films. Unfortunately, being a noble metal, gold does not adhere well to other materials and other metals may need to be deposited first to promote good adhesion. Titanium and chromium are the most common adhesion-promoting materials for gold and polysilicon applications. In polysilicon surface micromachining, gold has been proven to be a good choice as a reflective layer, since it is resistant to hydrofluoric acid etches, and provides good reflectivity after release.

Unfortunately, gold also may have a high self-diffusion rate, and has been shown to produce grain growth at temperatures as low as 90° C. This grain growth is described, for example, in the above-cited publication by Koch. Higher and higher temperatures show an increasing degree of stress. Moreover, because gold is soft, the stress will relax over time, even at room temperature. This is particularly troublesome when the flatness of the mirror requires a stable stress state in the metal film. Accordingly, stress-correcting layers 44b, for example comprising platinum, may provide a metal stack that is stress-stable after heating.

FIGS. 5A–5K are cross-sectional views of microelectronic reflectors and/or beams and fabrication methods therefor according to other embodiments of the present invention during intermediate fabrication steps. In FIGS. 5A–5K, embodiments of the present invention are integrated into a MUMPs process. However, other MEMS fabrication processes may be used.

Figure 5A:
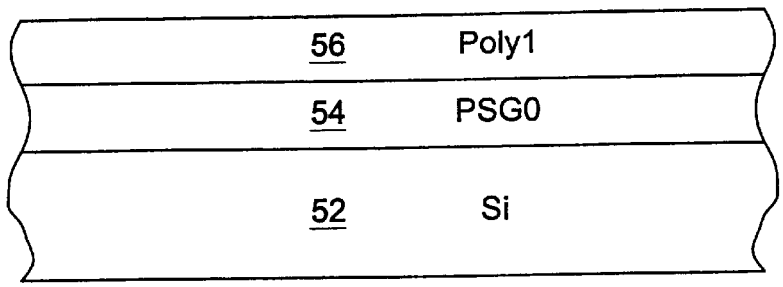
FIGS. 5A–5K are cross-sectional views of microelectronic reflectors and/or beams according to other embodiments of the present invention during intermediate fabrication steps.
Figure 5B:
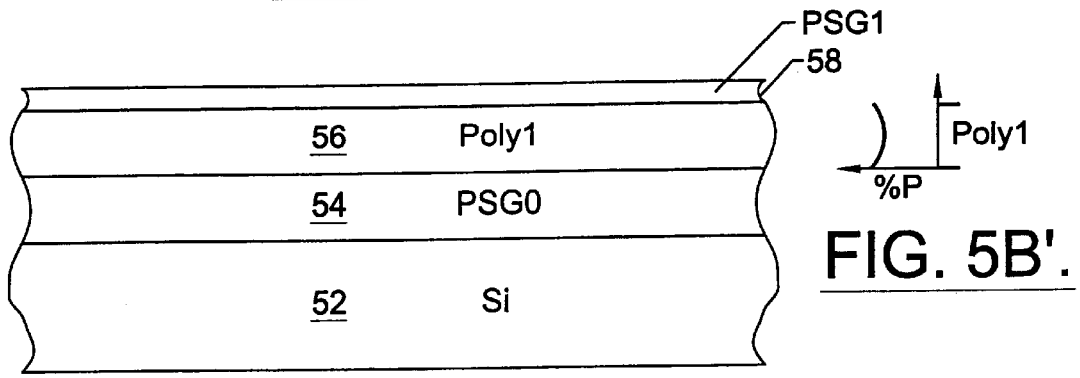

In particular, referring to FIG. 5A, a first polysilicon layer 54, for example about 2 μm in thickness, also referred to herein as Poly1, is fabricated on a layer of doped glass such as phosphosilicate glass (PSG) 54, for example about 2 μm in thickness, also referred to herein as PSG0, on a microelectronic substrate 52, such as a silicon semiconductor substrate. It will be understood that additional layers may be provided beneath the Poly1 layer 56 and/or beneath the PSG0 layer 54. Layers 54 and 56 may be fabricated using conventional MUMPs processing Then, referring to FIG. 5B, a layer of doped glass such as PSG, for example about 200 nm in thickness, also referred to herein as PSG1, is formed on the first polysilicon layer 56. An anneal preferably is performed, for example, at about 1050° C. for about one hour in an argon environment. This can create a phosphorus doping profile in the Poly1 layer 56, as shown in FIG. 5B'. As shown, the concentration of phosphorus is higher at the edges of the Poly1 layer and lower at the center of the Poly1 layer.

Figure 5C:
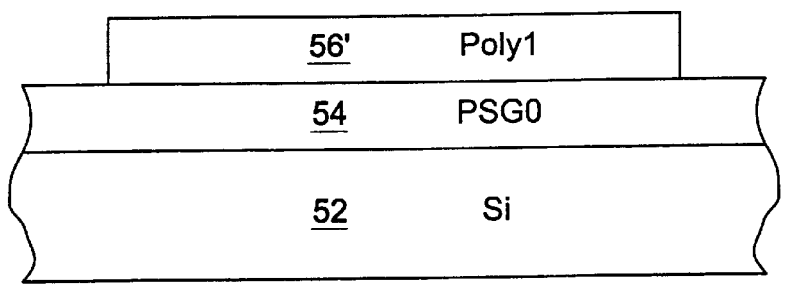
Figure 5D:
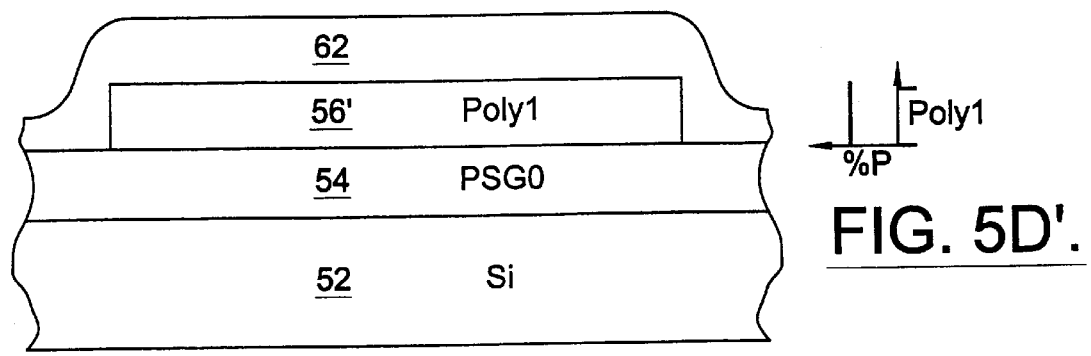

Referring now to FIG. 5C, an etch such as a reactive ion etch is performed to remove the first PSG layer 58 from at least a portion of the Poly1 layer 56 and to pattern the first polysilicon layer 56, to produce a first patterned polysilicon layer 56'. The reactive ion etch may use freon, and/or other conventional etchants. Then, referring to FIG. 5D, an optional layer of PSG 62, about 7500 Å in thickness, optionally is deposited and then annealed, preferably at about 1050° C. for about one hour in argon. As a result of this deposition and anneal, the phosphorus doping profile in the Poly1 layer may be uniform, as shown in FIG. 5D'.

Figure 5E:
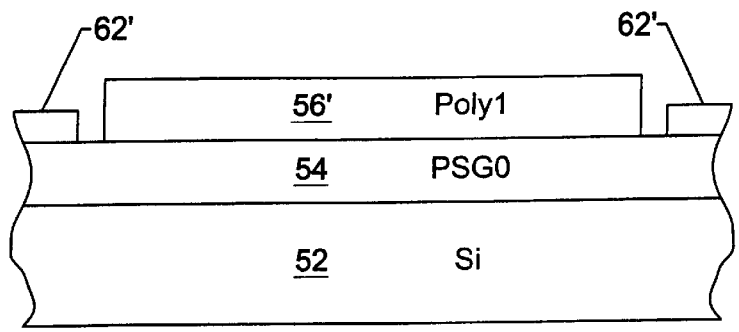

Then, as shown in FIG. 5E, the optional PSG layer 62 is etched by reactive ion etching, to remove the optional PSG layer 62 from at least a portion of the first patterned polysilicon layer 56'. A portion of the optional PSG layer 62' may remain, as shown in FIG. 5E.

Figure 5F:
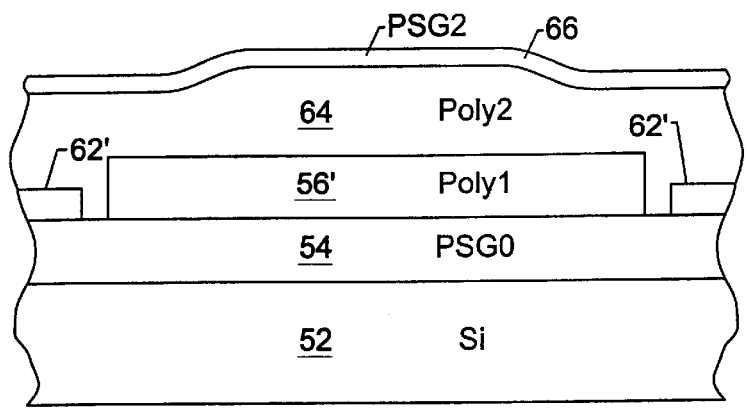
Figure 5F:
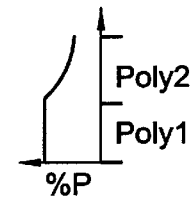

Referring now to FIG. 5F, a second polysilicon layer 64, for example about 1.5 μm thick, also referred to herein as a Poly2 layer, is formed. A second PSG layer 66, for example about 2000 Å thick, also referred to herein as PSG2, then is formed. An anneal then preferably takes place, for example at about 1050° C. for about one hour in argon. A possible doping profile in the first patterned polysilicon layer 56' and in the second polysilicon layer 64 after the anneal is shown in FIG. 5F'.

Figure 5G:
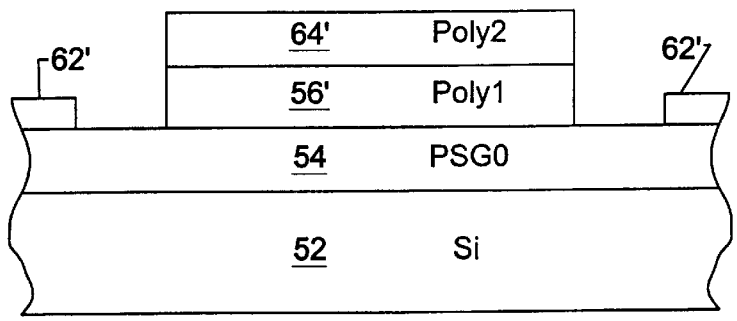
Figure 5G:
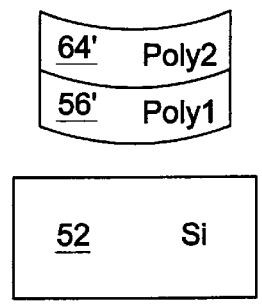

Referring now to FIG. 5G, a second reactive ion etch, for example in freon, is performed to remove the second PSG layer 66 and to pattern the second polysilicon layer 64 to produce a second patterned polysilicon layer 64'. As shown in FIG. 5G', if released at this point, a convex structure relative to the substrate 52 may be formed, which is undesirable for purposes of forming a microelectronic reflector. Alternatively, a flat or slightly concave structure may be formed as was described above in FIGS. 2A and 2C, respectively. A flat or uniform doping profile across the Poly1 and Poly2 layers may be produced.

Figure 5H:
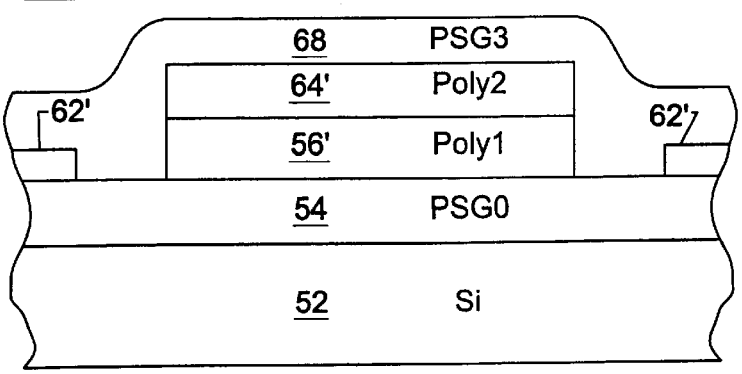
Figure 5H:
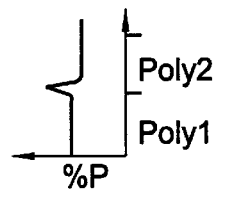

Referring now to FIG. 5H, a third PSG layer 68, also referred to as PSG3, for example about 5000 Å of PSG, then is deposited and preferably annealed, for example at about 1050° C. for about one hour in argon. This can produce a uniform doping profile except for a buried spike, as shown in FIG. 5H', wherein the spike is formed at the interface between layers 56' and 64'.

Figure 5I:
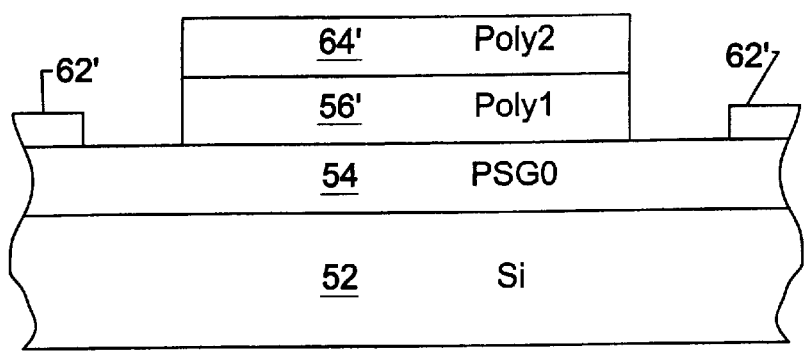
Figure 5I:
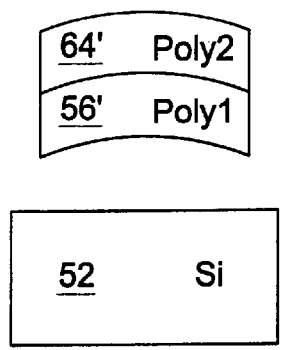

Then, as shown in FIG. 5I, a third reactive ion etch, for example in freon, is performed, to remove at least some of the third PSG layer 68'. As shown in FIG. 5I', if released, this structure would have a highly concave shape.

While not wishing to be bound by any particular theory of operation, it may be theorized that the formation, anneal, and/or reactive ion etch of the third PSG layer 68 shown in FIGS. 5H and 5I can change the doping profile of the structure from that of FIG. 5H', for example by producing or increasing a doping spike at the interface between the Poly1 layer and Poly2 layer. Moreover, the anneal and reactive ion etch may alter the surface morphology of the Poly2 layer. Combinations of these effects and/or other effects also may be produced, to cause the structure to have a highly concave shape relative to the substrate if released, as shown in FIG. 5I'. Qualitatively, at FIG. 5I, the radius of curvature of a released polysilicon base shown in FIG. 5I' may exceed about 200 mm at temperatures ranging between about −40° C. and about +90° C.

Figure 5J:
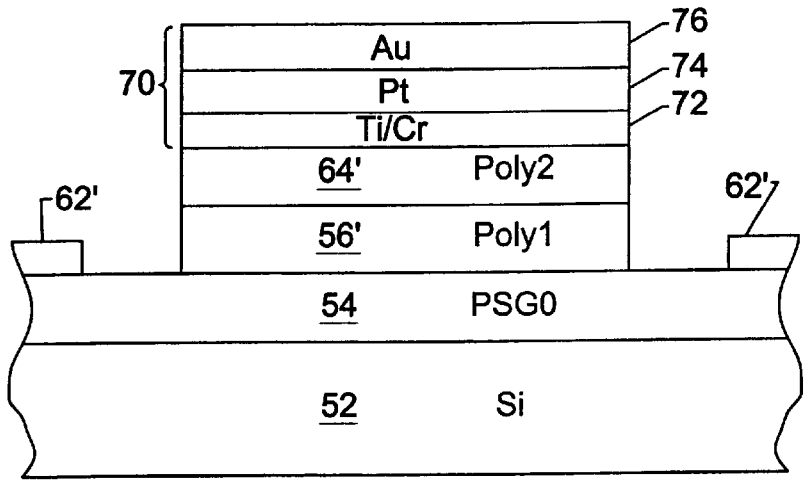

Then, referring to FIG. 5J, a metal stack 70 is formed on the second patterned polysilicon layer 64'. The metal stack comprises an optional adhesion-promoting layer 72, preferably comprising about 50 Å of titanium and/or about 50 Å of chromium, a stress-correcting layer 74 preferably comprising about 200 Å to about 300 Å of platinum, and a reflecting layer 76 preferably comprising about 50 Å of gold. It also will be understood that if a beam, rather than a reflector is being fabricated, the reflecting layer 76 may need not be included. However, a gold layer may be included for electrical contact and/or passivating purposes, even though a reflector is not being formed.

Figure 5K:
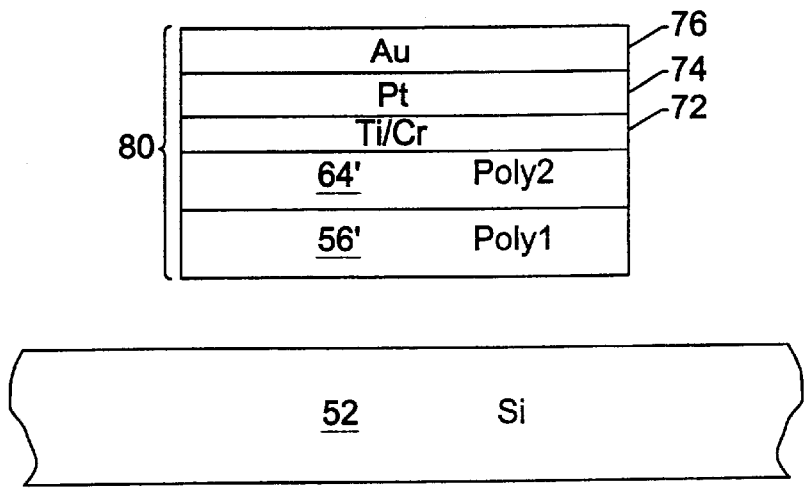

Finally, as shown in FIG. 5K, the PSG0 layer 54 is released, for example using conventional techniques. As shown, the reflector or beam 80 remains flat because the tensile strength of the platinum provides a stress that is equal and opposite to the compressive stress in the polysilicon layers 64' and 56'. A flat beam and/or mirror thereby may be produced.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A microelectronic reflector, comprising:

a microelectronic substrate;

a doped polysilicon base that is spaced apart from the microelectronic substrate;

a metal stress-correcting layer on the doped polysilicon base, opposite the substrate; and a metal reflective layer on the metal stress-correcting layer;

wherein the polysilicon base has a first stress therein; and wherein the metal stress-correcting layer has a second stress therein that is equal and opposite the first stress.

2. A reflector according to claim 1 wherein the doped polysilicon base comprises a phosphorous doped polysilicon layer.

3. A reflector according to claim 1 further comprising a metal adhesion-promoting layer between the doped polysilicon base and the metal stress-correcting layer.

4. A reflector according to claim 1 wherein the metal reflective layer comprises gold.

5. A reflector according to claim 4 wherein the metal stress-correcting layer comprises platinum.

6. A reflector according to claim 3:

wherein the metal reflective layer comprises gold;

wherein the metal stress-correcting layer comprises platinum; and wherein the metal adhesion-promoting layer comprises titanium or chromium.

7. A reflector according to claim 6 wherein the titanium or chromium layer is about 50 Å thick, wherein the platinum layer is at least about 200 Å thick and wherein the gold layer is about 50 Å thick.

8. A reflector according to claim 6 wherein the platinum layer is at least twice as thick as the sum of the thickness of the titanium of chromium layer and the gold layer.

9. A microelectronic reflector, comprising:

a microelectronic substrate;

a doped polysilicon base that is spaced apart from and movable relative to the microelectronic substrate;

a platinum layer on the doped polysilicon base, opposite the substrate; and a gold reflector layer on the platinum layer.

10. A reflector according to claim 9 wherein the doped polysilicon base comprises a phosphorous doped polysilicon layer.

11. A reflector according to claim 10 further comprising a titanium or chromium layer between the doped polysilicon base and the platinum layer.

12. A reflector according to claim 11 wherein the titanium or chromium layer about 50 Å thick, wherein the platinum layer is at least about 200 Å thick and wherein the gold layer is about 50 Å thick.

13. A reflector according to claim 11 wherein the platinum layer is at least twice as thick as the sum of the thickness of titanium or chromium layer and the gold layer.

* * * * *